(12) United States Patent
Erickson et al.

(10) Patent No.: US 11,353,668 B2
(45) Date of Patent: Jun. 7, 2022

(54) PACKAGING WITH SUBSTRATE AND PRINTED CIRCUIT BOARD CUTOUTS

(71) Applicant: Cisco Technology, Inc., San Jose, CA (US)

(72) Inventors: Ashley J. M. Erickson, Danville, CA (US); Vipulkumar K. Patel, Breinigsville, PA (US); Aparna R. Prasad, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 17/070,763

(22) Filed: Oct. 14, 2020

(65) Prior Publication Data

US 2022/0113480 A1    Apr. 14, 2022

(51) Int. Cl.
*G02B 6/42*    (2006.01)
*G02B 6/13*    (2006.01)
*G02B 6/12*    (2006.01)

(52) U.S. Cl.
CPC ......... *G02B 6/428* (2013.01); *G02B 6/12004* (2013.01); *G02B 6/13* (2013.01); *G02B 6/4269* (2013.01); *G02B 2006/12085* (2013.01)

(58) Field of Classification Search
None
See application file for complete search history.

(56) References Cited

U.S. PATENT DOCUMENTS

| | | | |
|---|---|---|---|
| 5,631,807 A * | 5/1997 | Griffin | G02B 6/4266 361/794 |
| 7,433,554 B2 * | 10/2008 | Warashina | G02B 6/43 385/132 |
| 7,539,366 B1 | 5/2009 | Baks et al. | |
| 10,393,959 B1 | 8/2019 | Razdan et al. | |
| 2002/0196997 A1 | 12/2002 | Chakravorty et al. | |
| 2003/0002770 A1 | 1/2003 | Chakravorty et al. | |
| 2004/0208416 A1 | 10/2004 | Chakravorty et al. | |
| 2006/0091509 A1 | 5/2006 | Zhao et al. | |
| 2008/0006934 A1 | 1/2008 | Zhao et al. | |
| 2009/0226130 A1 | 9/2009 | Doany et al. | |
| 2010/0215314 A1 * | 8/2010 | Lau | G02B 6/43 385/14 |
| 2012/0188138 A1 * | 7/2012 | Liu | H01Q 13/02 343/776 |
| 2014/0064659 A1 | 3/2014 | Doerr et al. | |
| 2014/0084441 A1 * | 3/2014 | Chiu | H01L 23/13 257/692 |
| 2017/0097480 A1 * | 4/2017 | Wang | G02B 6/4238 |
| 2017/0307837 A1 * | 10/2017 | Gektin | G02B 6/4246 |

* cited by examiner

*Primary Examiner* — Michael Stahl
(74) *Attorney, Agent, or Firm* — Patterson + Sheridan, LLP

(57) ABSTRACT

An integrated circuit (IC) package having multiple ICs is provided. The IC package includes a printed circuit board (PCB) having a cutout region and a substrate disposed above the PCB. The substrate includes a first cavity on a first surface of the substrate. The IC package also includes a first IC disposed on a second surface of the substrate and in the cutout region of the PCB, The IC package further includes a second IC disposed above the substrate, and a first device disposed on the second IC and in the first cavity on the first surface of the substrate.

20 Claims, 18 Drawing Sheets

Top View

Side View

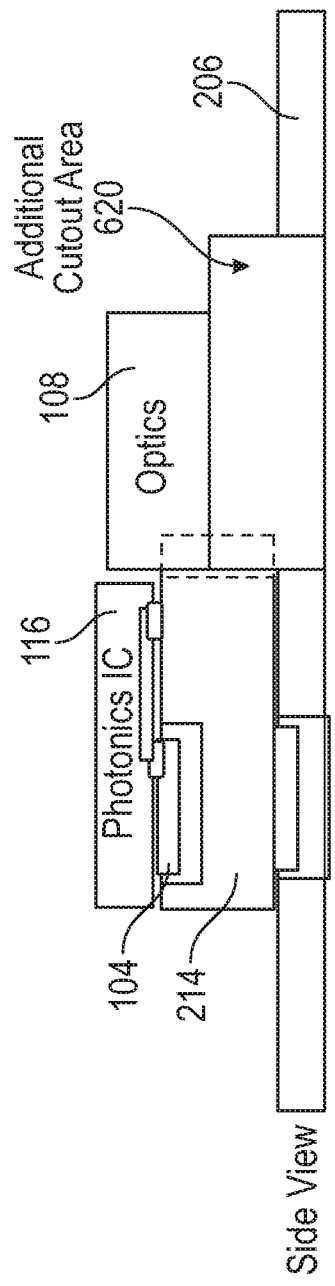
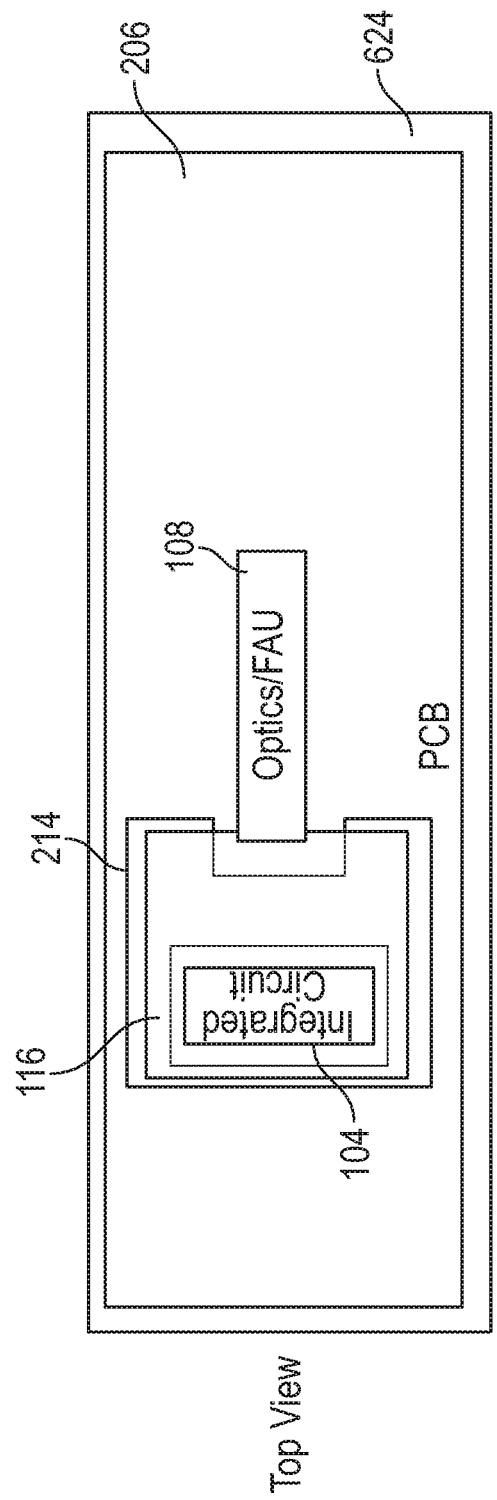

PACKAGING WITH SUBSTRATE AND PRINTED CIRCUIT BOARD CUTOUTS

TECHNICAL FIELD

Embodiments presented in this disclosure generally relate to optical networking, and more specifically, to photonics packaging with substrate and printed circuit board (PCB) cutouts.

BACKGROUND

Electronic devices (e.g., computers, laptops, tablets, copiers, digital cameras, smart phones, and the like) often employ integrated circuits (ICs, also known as "chips"). These integrated circuits are typically implemented as semiconductor dies packaged in integrated circuit packages. The semiconductor dies may include numerous active devices and/or passive devices located on-chip. These devices may occupy a large amount of area on the chip, reducing the amount of space available for other components.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1A:
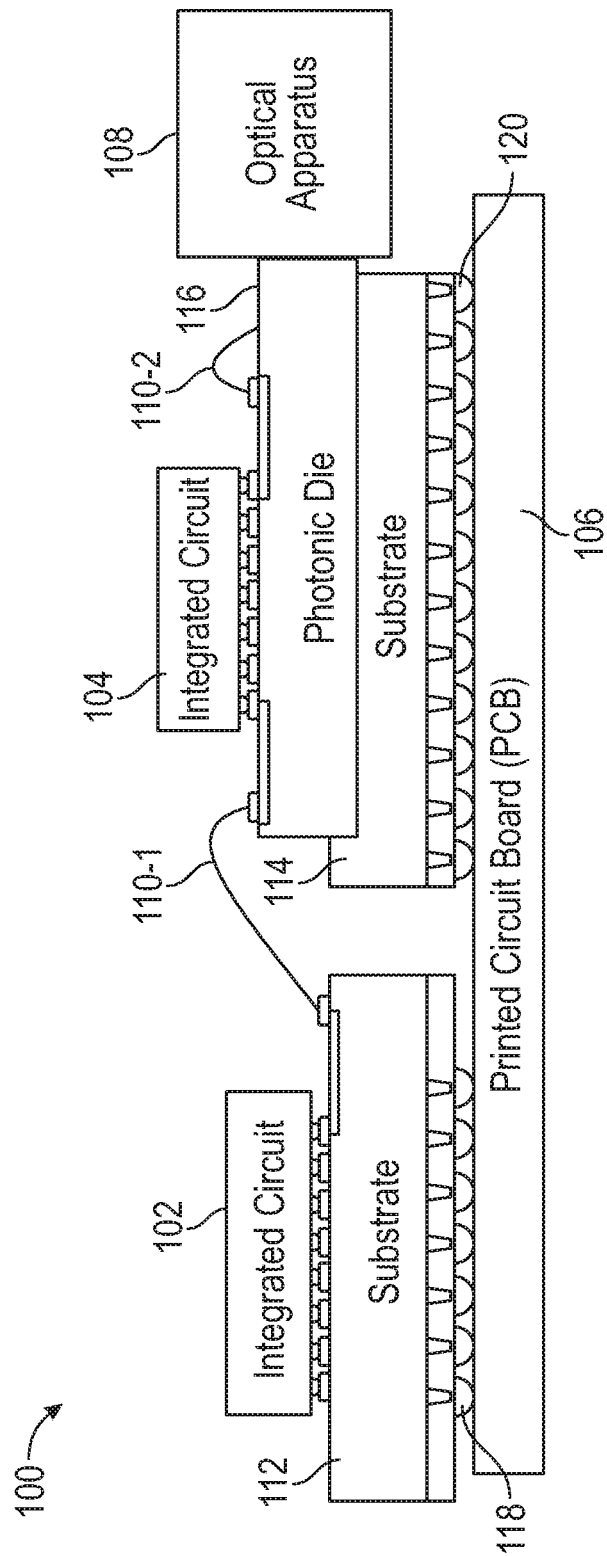
FIG. 1A illustrates a cross-sectional view of a multi-chip package.

One embodiment presented in this disclosure is an integrated circuit (IC) package. The IC package includes a printed circuit board (PCB) having a cutout region and a substrate disposed above the PCB. The substrate includes a first cavity on a first surface of the substrate. The IC package also includes a first IC disposed on a second surface of the substrate and in the cutout region of the PCB. The IC package further includes a second IC disposed above the substrate, and a first device disposed on the second IC and in the first cavity on the first surface of the substrate.

Another embodiment presented in this disclosure is a method for fabricating an integrated circuit (IC) package. The method generally includes forming a printed circuit board (PCB) having a cutout region and forming a substrate above the PCB. The substrate has at least a first cavity on a first surface of the substrate. The method also includes forming a first IC on a second surface of the substrate and in the cutout region of the PCB. The method further includes forming a second IC above the substrate and forming a first device on the second IC and in the first cavity on the first surface of the substrate.

Another embodiment presented in this disclosure is an optical transceiver module. The optical transceiver module includes a package with a plurality of integrated circuits (ICs). The package includes a printed circuit board (PCB) having a cutout region and a substrate disposed above the PCB. The substrate includes a first cavity on a top surface of the substrate. The package also includes a first IC of the plurality of ICs disposed on a bottom surface of the substrate and in the cutout region of the PCB. The package further includes a second IC of the plurality of ICs disposed above the substrate, a third IC of the plurality of ICs disposed on the second IC and in the first cavity on the top surface of the substrate, and an optical device coupled to the second IC.

EXAMPLE EMBODIMENTS

Electrical connections providing power and signaling to photonic chips typically include wire bonding to a printed circuit board (PCB) or other substrate. However, with increasing bandwidths, maintaining power and signal integrity may be difficult with wire bonding. Further, multi-chip integration (e.g., a photonic IC, an analog IC, a digital signal processor (DSP), and so forth) may be difficult due to a limited scalability of wire bonding. For example, wire bonds may be limited to edge connections, may require more complex on-chip routing, may occupy a relatively large chip and package footprint, and/or may be more susceptible to cross-talk and IR drop.

Embodiments presented herein provide IC packages (also referred to as chip packages or chip packaging or IC packaging) that are suitable for increasing the number of chips within a single package, for example. More specifically, embodiments provide techniques for using cutout(s) and cavity features on a substrate and/or printed circuit board (PCB) to improve the manufacturability, signal integrity, and size of an IC package for high speed transceiver applications, for example.

The following description provides examples, and is not limiting of the scope, applicability, or embodiments set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The word "exemplary" is used herein to mean "serving as an example, instance, or illustration," Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected there between).

In conventional IC packages with multiple ICs (or chips), wire bonding is typically used to connect (or link) the ICs to the printed circuit board (PCB) (or substrate), One issue with this conventional approach is that it may not be suitable for packaging multiple chips inside an optical transceiver module, due in part to signal integrity issues and a large area footprint. For example, wire bonding can cause signal integrity issues, reducing the suitability of this approach for certain applications (e.g., high speed transceiver applications) that rely on high signal integrity between IC components. Additionally, the multiple chips that are connected via wire bonding can occupy a significantly large area footprint within the multi-chip package, thereby increasing the size of the multi-chip package which can make it unsuitable for fitting multiple chips inside a transceiver module.

Figure 1B:
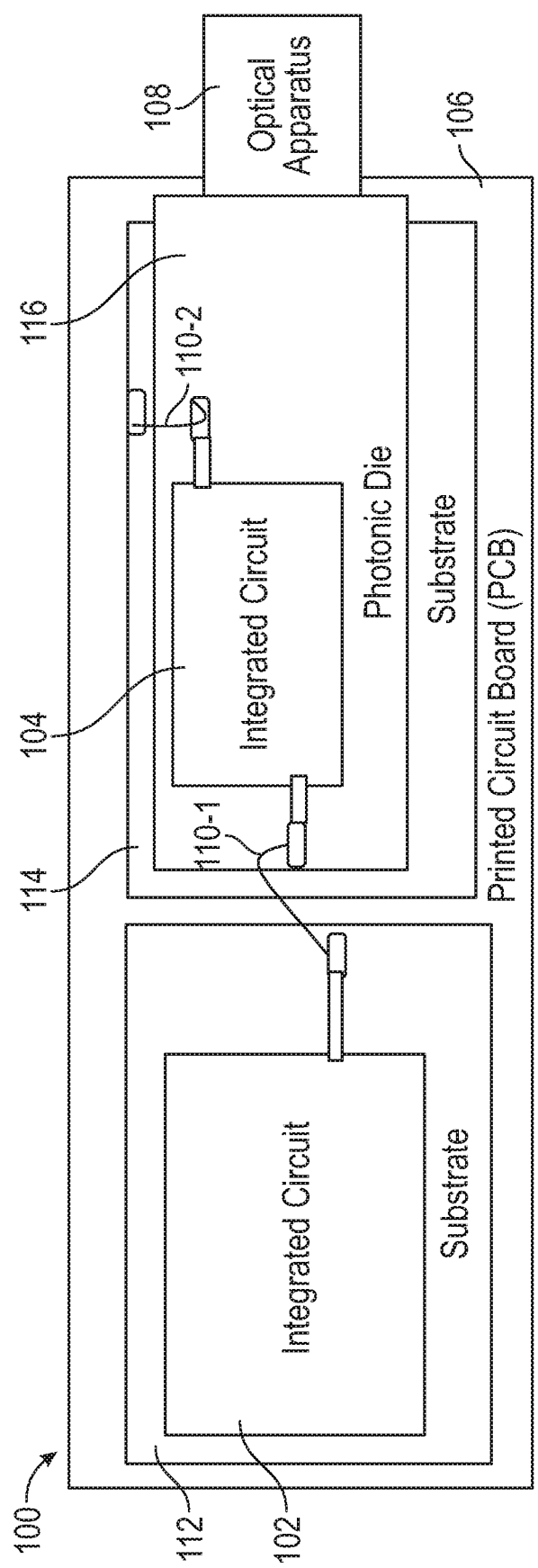
FIG. 1B illustrates a top view of a multi-chip package.
Figure 1C:
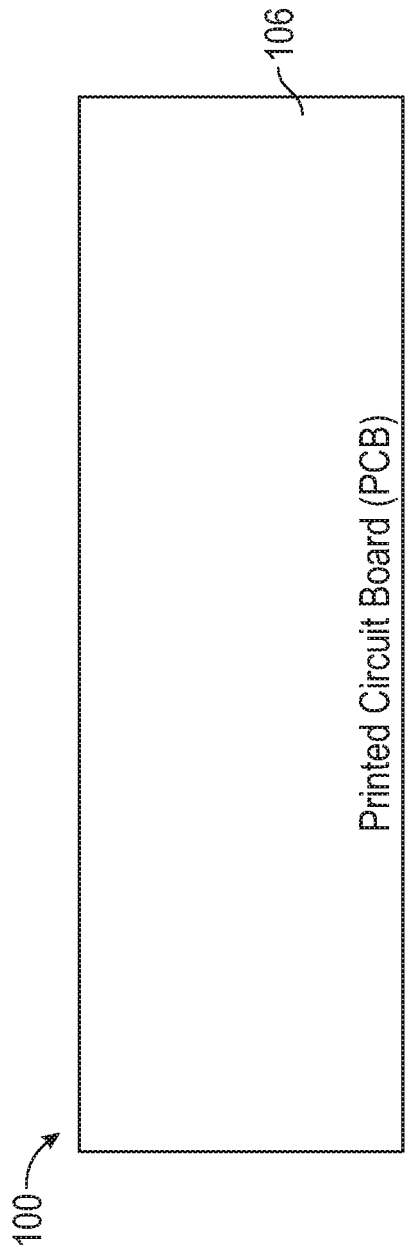
FIG. 1C illustrates a bottomview of a multi-chip package.

FIGS. 1A-1C, for example, show a cross-sectional view, a top view, and a bottom view, respectively, of a multi-chip package 100 that occupies a large silicon area footprint. As shown, the multi-chip package 100 is a two chip package with IC (or chip) 102 and IC (or chip) 104. In one embodiment, the multi-chip package 100 can be used for a transceiver application. For example, the IC 102 can include the (main) electronics IC and the IC 104 can include a Mach-Zehnder Interferometer (MZI)/transimpedance amplifier (TIA). The MZI/TIA driver can be used to control the optics 108 (also referred to as an optical apparatus). The multi-chip package 100 includes a PCB 106 for supporting multiple substrates of the multiple ICs. For example, the IC 102 is disposed above the substrate 112, which is disposed above the PCB 106. Similarly, the IC 104 is disposed above the photonics die 116, which is disposed above the substrate 114, which is disposed above the PCB 106. The substrate 112 and the substrate 114 are connected to the PCB 106 via solder balls 118 and 120, respectively.

The multi-chip package 100 uses wire bond 110-1 to connect the ICs 102 and 104 and wire bond 110-2 to connect the photonics die 116 to the substrate 114. As noted above, however, the wire bonds 110 1-2 can cause signal integrity issues, impacting the performance of the optics 108. Additionally, due in part to substrates 112 and 114, the ICs 102 and 104 can occupy a significantly large area footprint within the multi-chip package 100, reducing its suitability for high speed transceiver applications.

To address this, embodiments described herein provide techniques for IC packaging that utilizes strategically placed cavities and/or cutouts to package multiple electrical chips within a single IC package. In some embodiments, the techniques described herein leverage established packaging techniques (e.g., flip chip, die attach, soldering, etc.) to overcome the limitations associated with wire bonding. In this manner, embodiments can increase the manufacturability, improve signal integrity, and reduce the size of an IC package to make it more suitable for high speed transceiver applications.

Figure 2A:
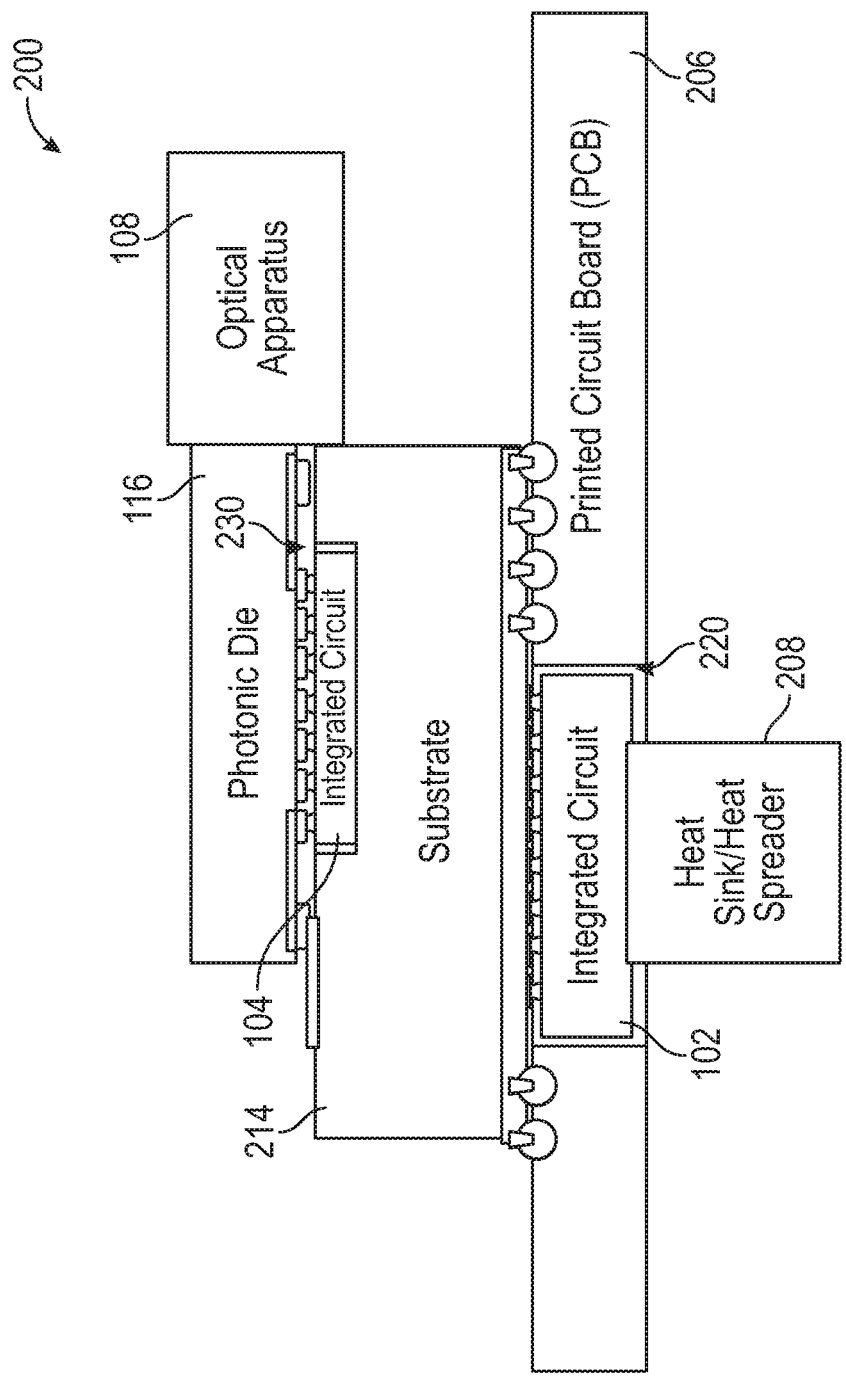
FIG. 2A illustrates a cross-sectional view of a multi-chip package, according to one embodiment.
Figure 2B:
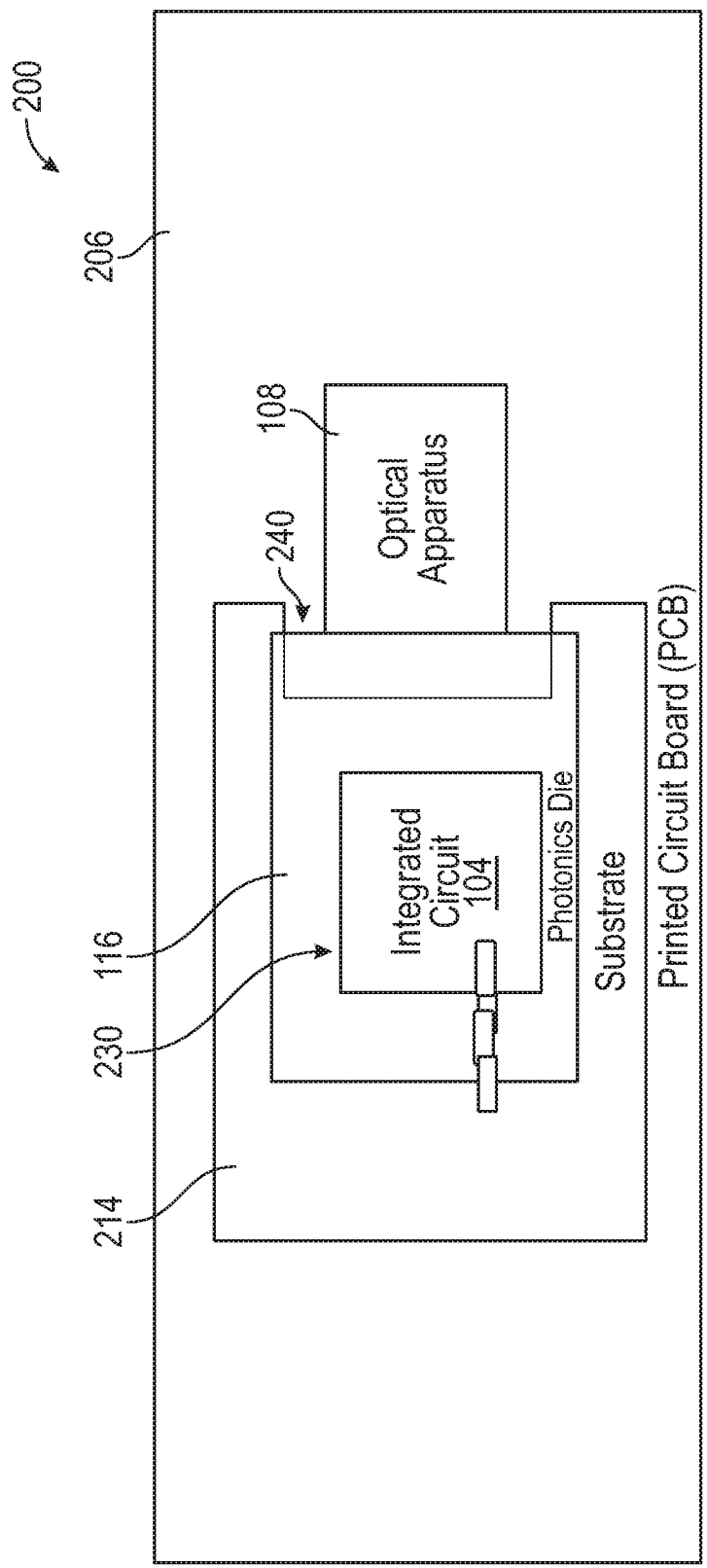
FIG. 2B illustrates a top view of a multi-chip package, according to one embodiment.
Figure 2C:
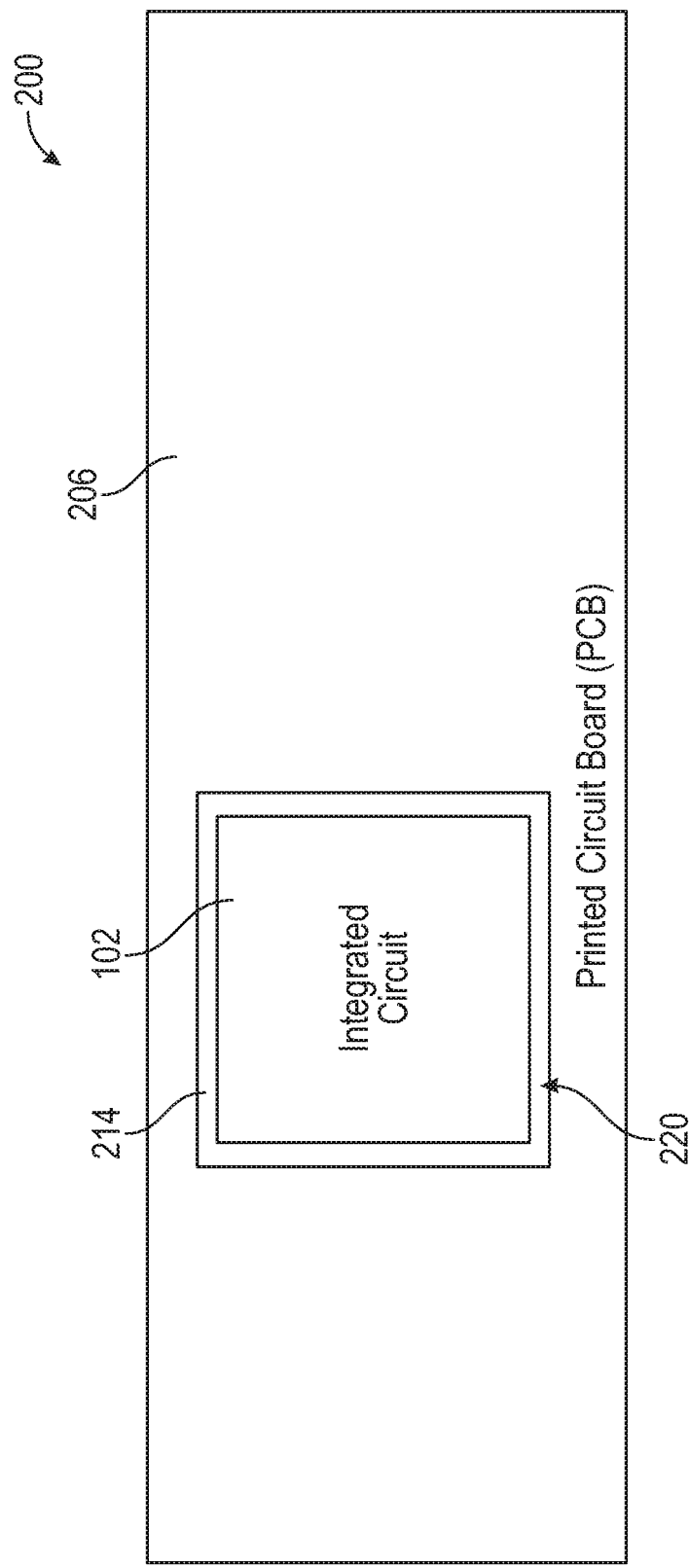
FIG. 2C illustrates a bottom view of a multi-chip package, according to one embodiment.

FIGS. 2A-2C illustrate a cross-sectional view, a top view, and a bottom view, respectively, of an example IC package 200 with multiple ICs (or chips), according to one embodiment. As shown in FIG. 2A, the IC package 200 includes a PCB 206, a substrate 214 (e.g., silicon (Si) substrate) disposed above the PCB 206, and a photonics die 116 (or, more generally, a semiconductor die) disposed above the substrate 214. Compared to the multi-chip package 100, the IC package 200 can include one or more cutouts and/or cavities for disposing one or more ICs. The cutouts and/or cavities allow for the ICs to be connected to the substrate 214 via flip chip technique, which allows for improved signal integrity and power integrity (relative to wire bonding processes). Similarly, the cutouts and/or cavities allow for a single substrate to be used for multiple chips, saving space and costs associated with housing multiple chips within an IC package.

As shown in FIG. 2C, for example, the PCB 206 includes a cutout 220 (also referred to as a cutout region) that extends from a bottom surface of the PCB 206 to the top surface of the PCB 206. In one embodiment, the IC 102 is disposed within the cutout 220 of the PCB 206. For example, the cutout 220 allows a portion of the bottom surface of the substrate 214 to be exposed through the PCB 206 and the IC 102 to be attached through the PCB 206. Using a cutout on the PCB 206 allows the IC 102 to be attached underneath the substrate 214 to save space and provides for convenient heat sink access, e.g., via the heat sink/heat spreader 208. While the IC package 200 is depicted as having a single cutout within the PCB 206, the reader is to understand that the IC package 200 may include more than a single cutout within the PCB 206.

As also shown, the substrate 214 includes a cavity 230 (FIG. 2A) and a cavity 240 (FIG. 2B) on the top surface of the substrate 214. In one embodiment, the IC 104 is disposed within the cavity 230 of the substrate 214. For example, the cavity 230 allows for the photonics die 116 to be flip chip attached to the substrate 214, and for the IC 104 to be disposed (upside down) within the cavity 230 of the substrate 214. In some embodiments, by adding indentations or cavity structures to the substrate 214, the photonics die 116 can be flip chip attached to the substrate 214 without interfering with other IC(s) (e.g., IC 102), lasers, or other components already attached to the substrate 214 and/or photonics die 116. For example, while the photonics die 116 is attached upside down, MZI/TIA chips and other components such as lasers can be attached on the top surface of the photonics die 116 before it is flip chip attached to the substrate 214.

As shown in FIG. 2B, the cavity 240 allows for improved mechanical stability of the optics 108. This cavity 240 may also allow for easier coupling of the optics 108 to the photonics die edge (e.g., without requiring the entire edge of the photonics die to hang off the edge of the substrate 214). Note FIG. 2B depicts the photonics die 116 as transparent to show the IC 104 and flexible coupling of the optics 108 to the die edge. While the IC package 200 is depicted as having a single cavity within the substrate 214, the reader is to understand that the IC package 200 may include more than a single cavity within the substrate 214. For example, additional cavities can allow other components such as lasers to be attached to the photonics die.

Figure 3:
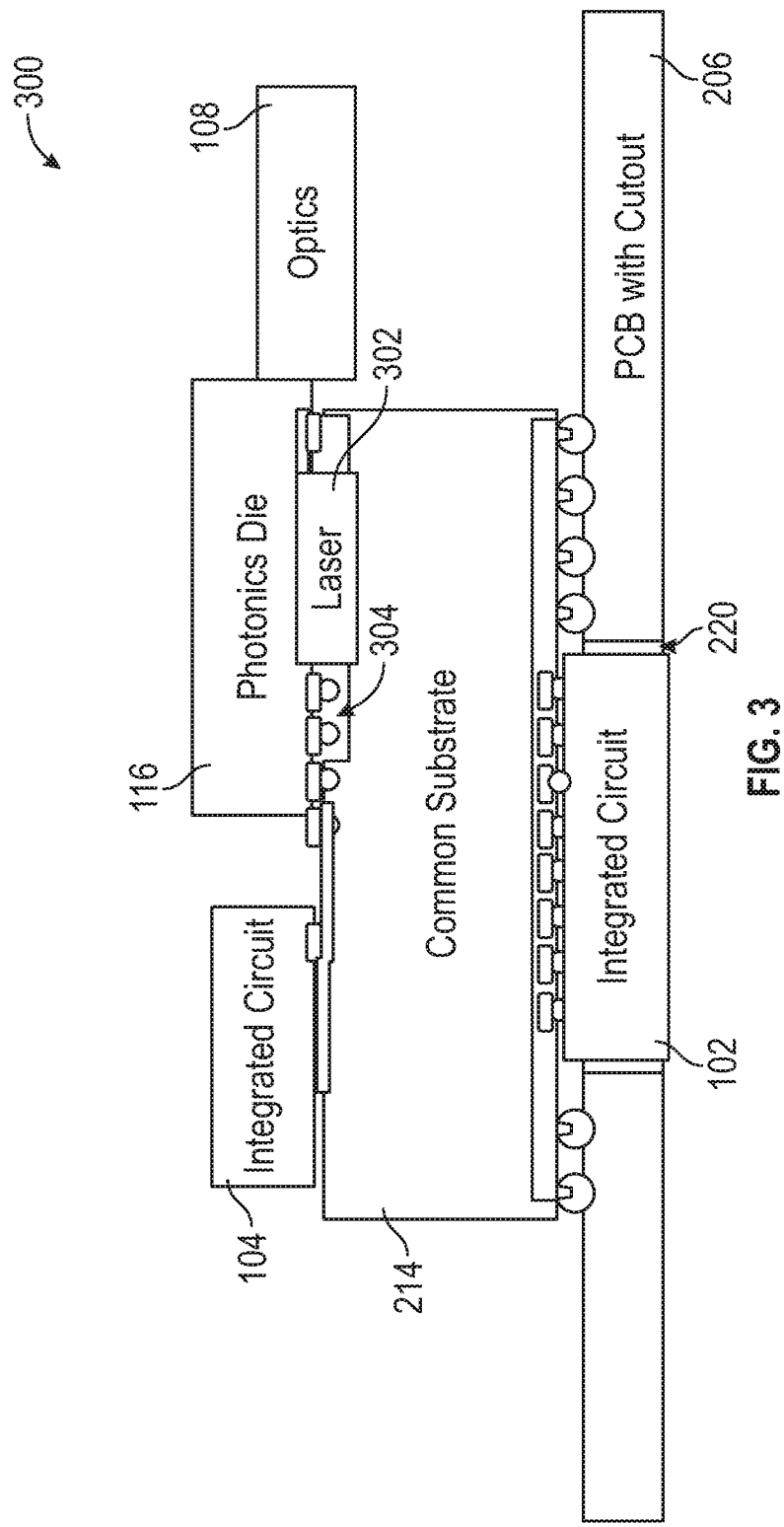
FIG. 3 illustrates a cross-sectional view of another multi-chip package, according to one embodiment.

In some embodiments, techniques presented can use one or more cavities and/or cutouts to accommodate other components, e.g., a laser. FIG. 3, for example, illustrates a cross-sectional view of an IC package 300 with multiple ICs (or chips), according to one embodiment. Compared to the IC package 200, the IC package 300 includes a cavity (or indentation) 304 on the top surface of the substrate 214. Here, the cavity 304 allows for the photonics die 116 to be flip chip attached to the substrate 214, and for the laser 302 to be disposed (upside down) within the cavity 304 of the substrate 214. As also shown in this embodiment, the IC package 300 includes the IC 104 disposed above the substrate 214 (e.g., as opposed to being disposed within a cavity of the substrate 214). While the IC package 300 is depicted as having a laser 302 within the cavity 304, the reader is to understand that the cavity 304 can be used to accommodate other optics and components (e.g., instead of or in addition to the IC 104).

Figure 4:
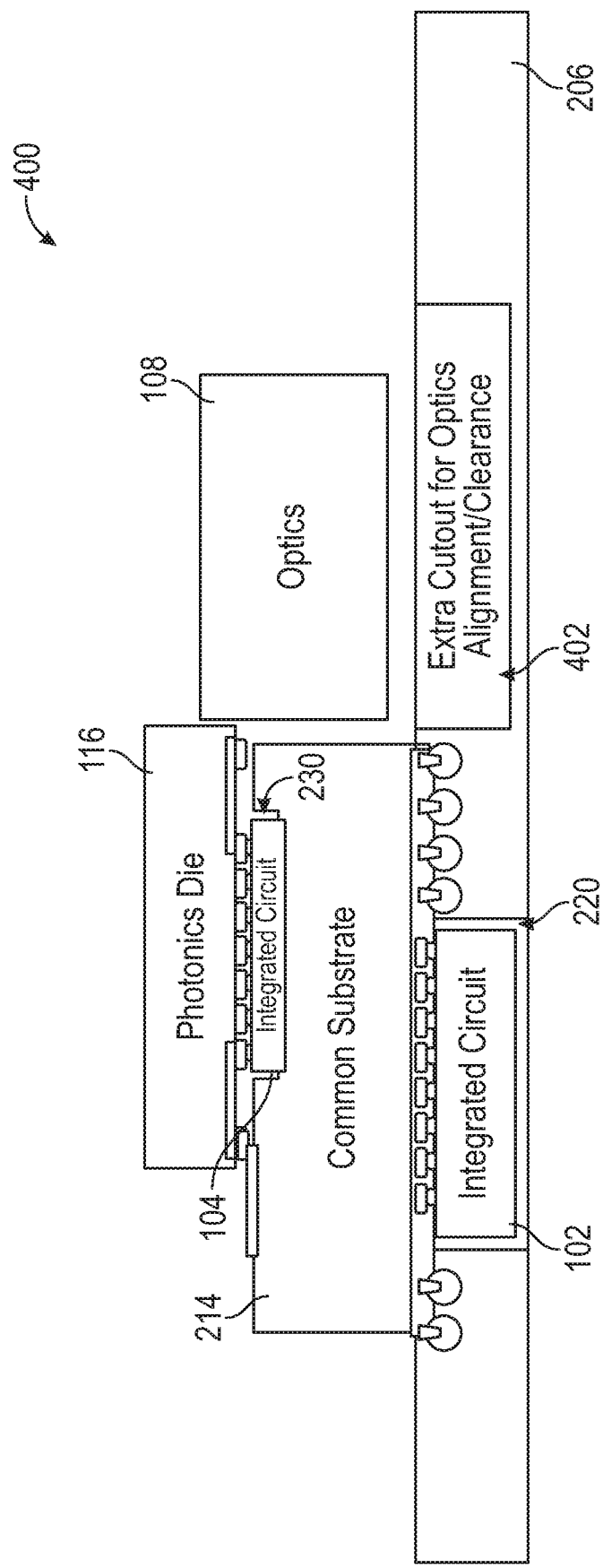
FIG. 4 illustrates a cross-sectional view of another multi-chip package, according to one embodiment.

FIG. 4 illustrates a cross-sectional view of another example IC package 400 with multiple ICs (or chips), according to one embodiment. Compared to the IC package 200, the IC package 400 includes an additional (or extra) region 402 within the PCB 206. The region 402 can be used to give clearance for optics, alignment of the optics, etc. In the embodiment shown in FIG. 4, for example, the region 402 is a cavity within the PCB 206 that is (i) adjacent to the cutout 220 within the PCB 206 and (ii) below the optics 108. In another embodiment (not shown), the region 402 is a cutout region within the PCB 206 (e.g., similar to cutout 220) disposed below the optics 108.

Figure 5:
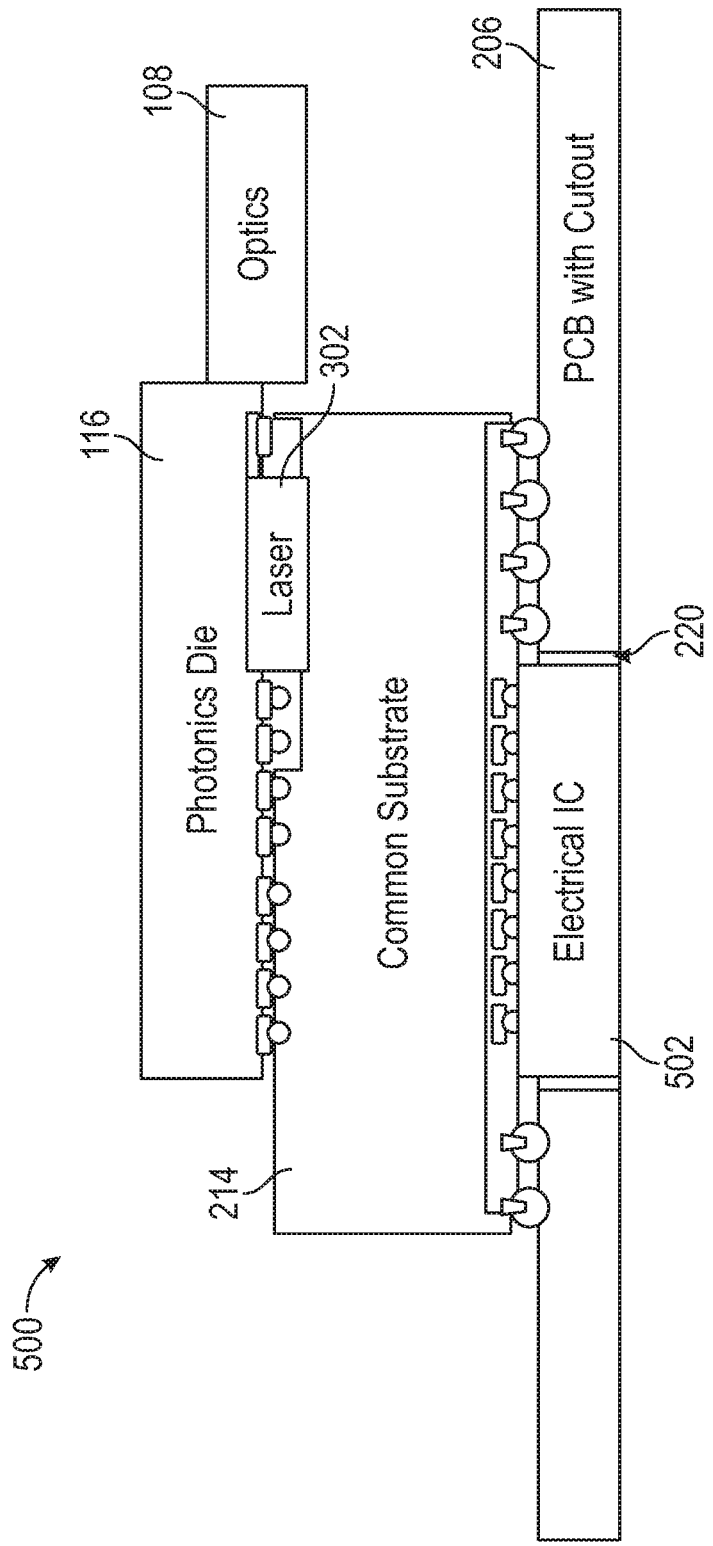
FIG. 5 illustrates a cross-sectional view of another multi-chip package, according to one embodiment.

In some embodiments, the IC package described herein can be configured with a single IC (instead of multiple ICs). FIG. 5, for example, illustrates a cross-sectional view of an IC package 500 with a single IC (or chip) 502, according to one embodiment. Compared to the IC package 200, the IC package 500 includes the IC 502, which is disposed in the cutout 220 of the PCB 206. In this embodiment, one or more cutouts and flip chip techniques can be used to enable packaging the photonics IC with a single IC. In this manner, embodiments can improve power integrity, signal integrity, and eliminate wire bonding even for the single IC case.

Figure 6A:
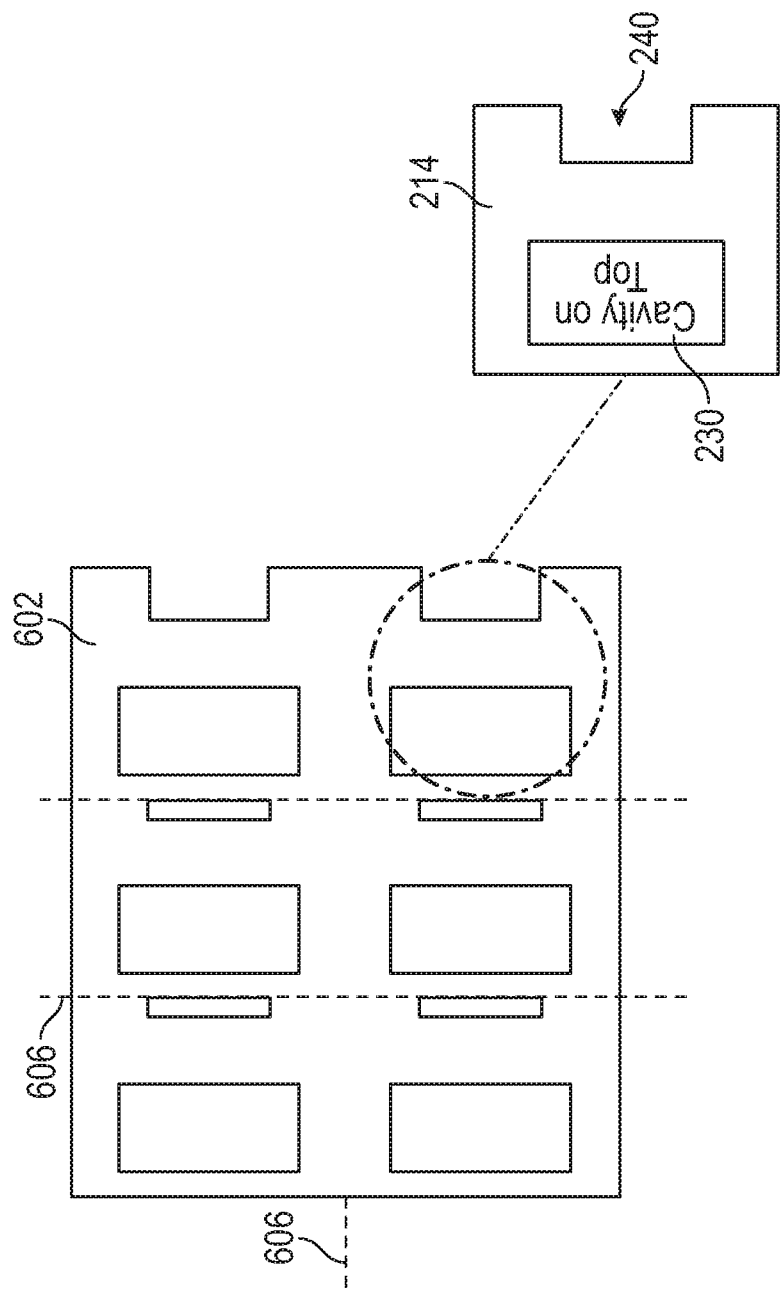
FIGS. 6A-6N illustrate example processes to fabricate a multi-chip package, according to one embodiment.
Figure 6B:
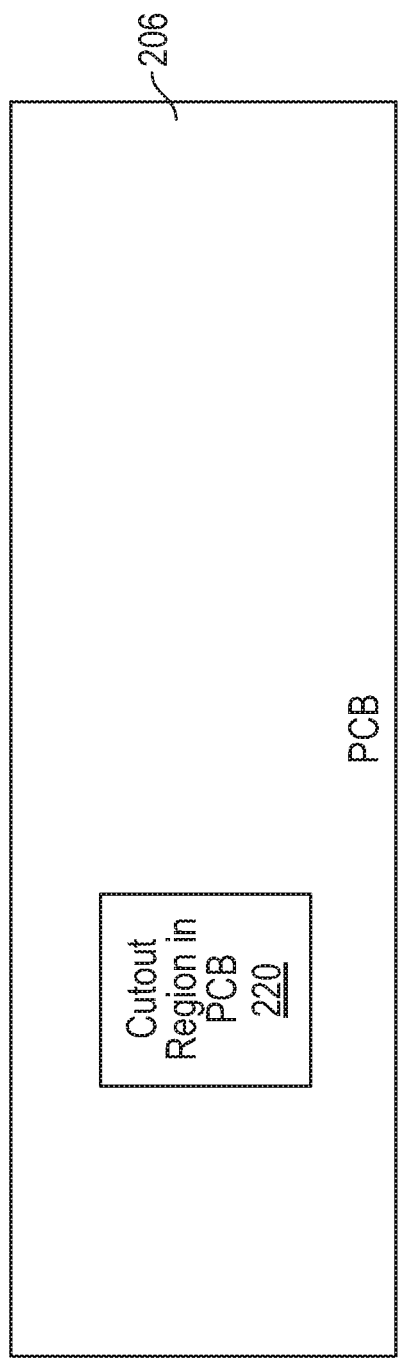
Figure 6C:
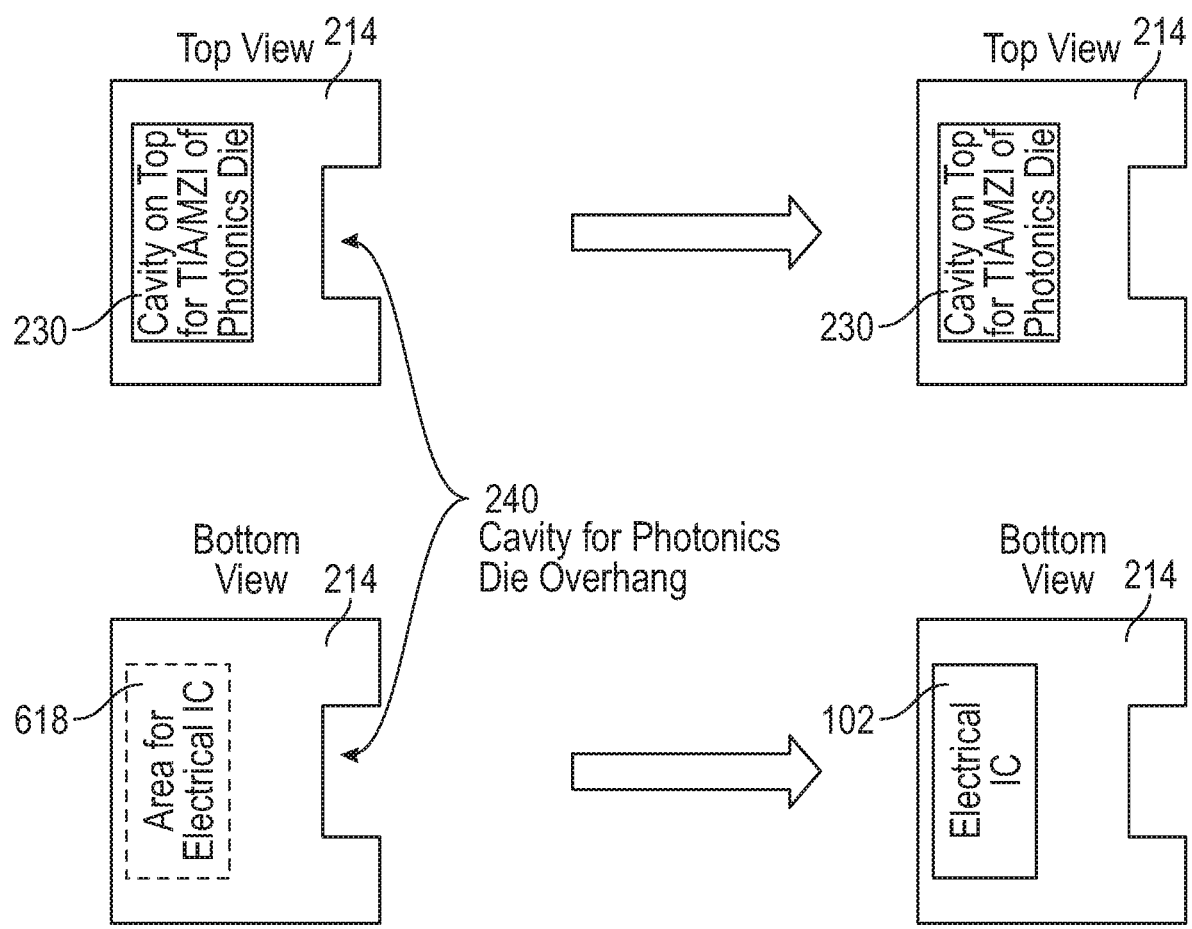
Figure 6D:
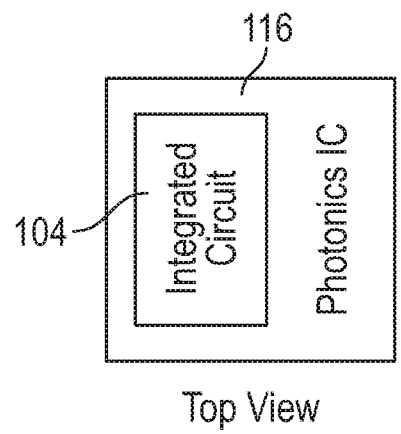
Figure 6E:
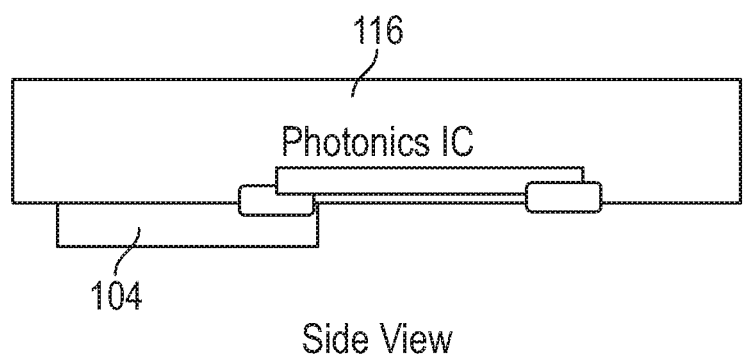
Figure 6F:
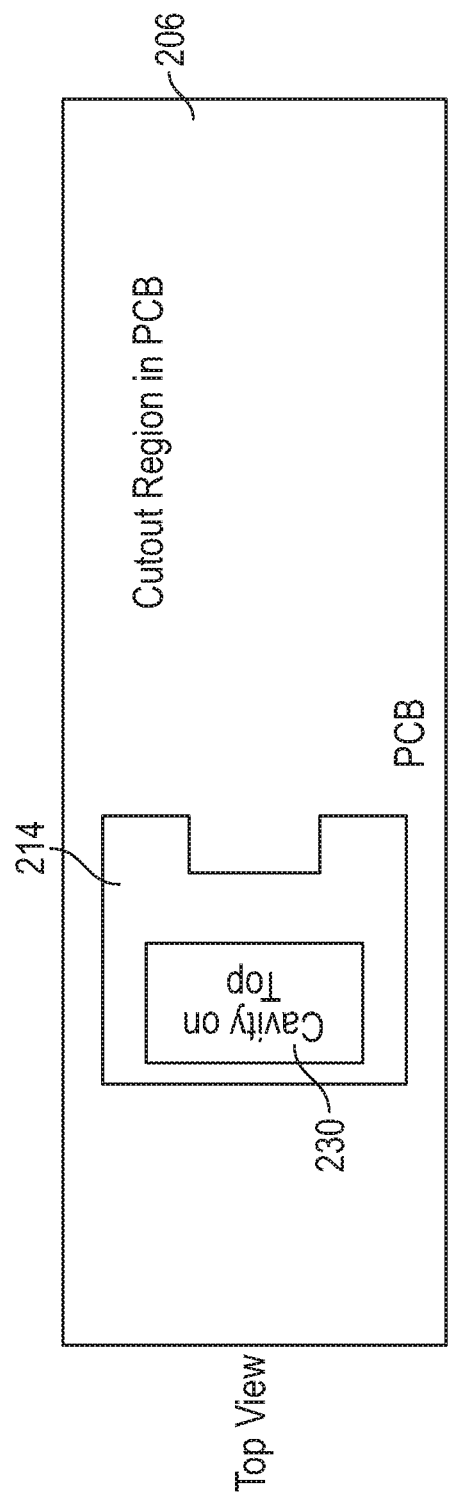
Figure 6G:
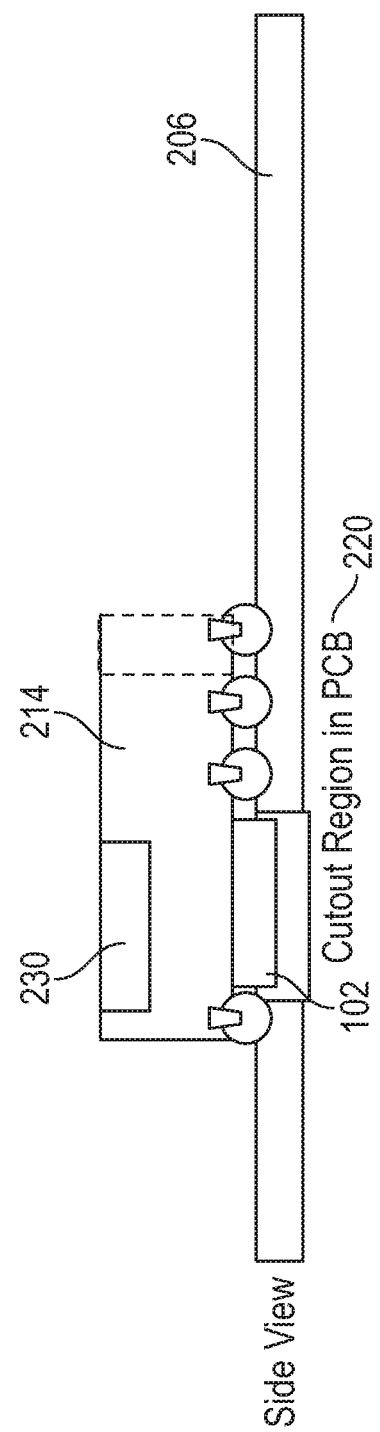
Figure 6H:
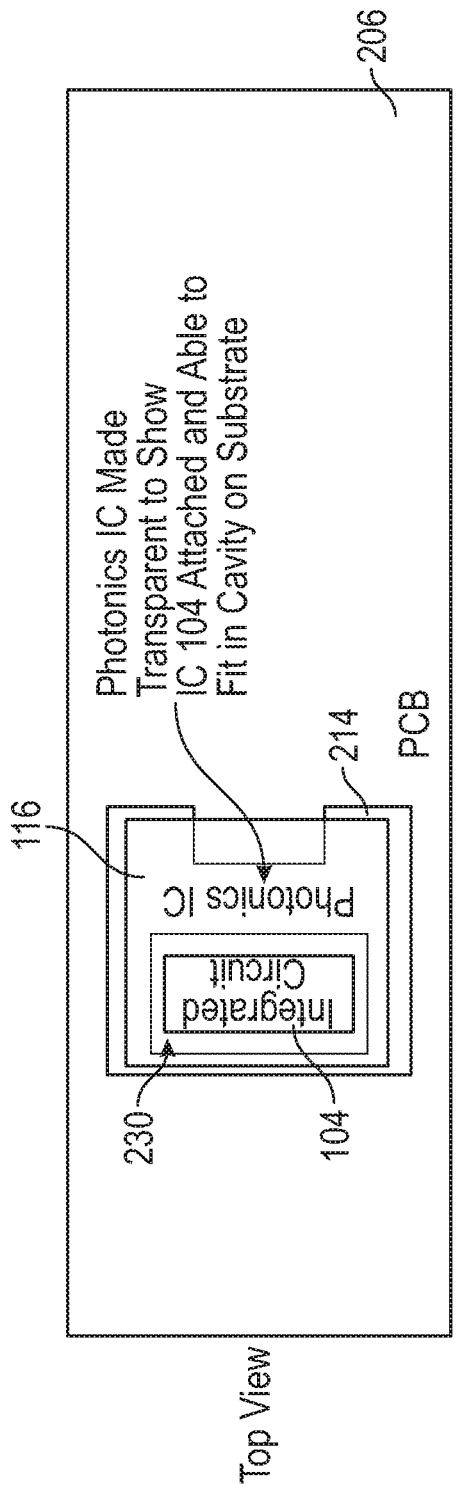
Figure 6I:
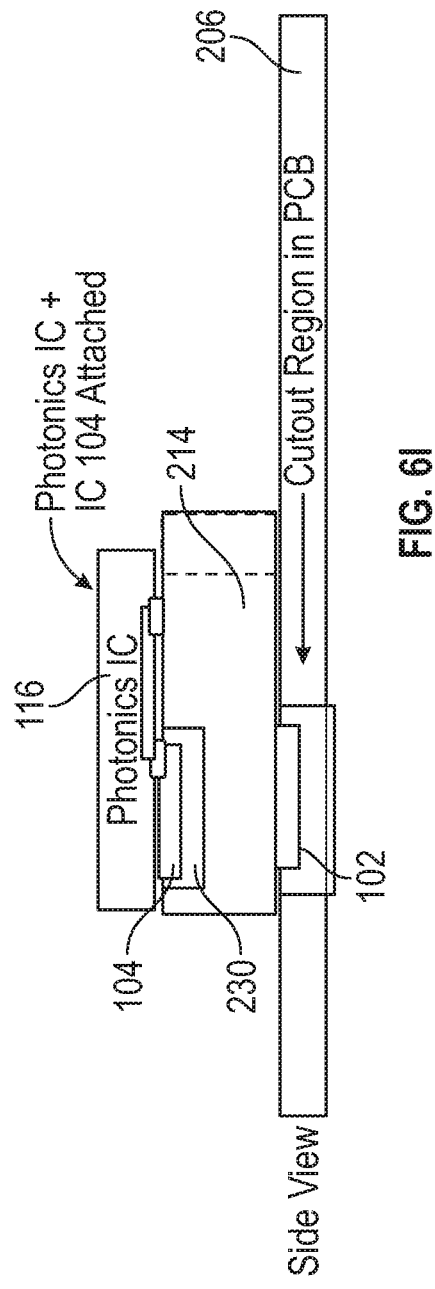
Figure 6J:
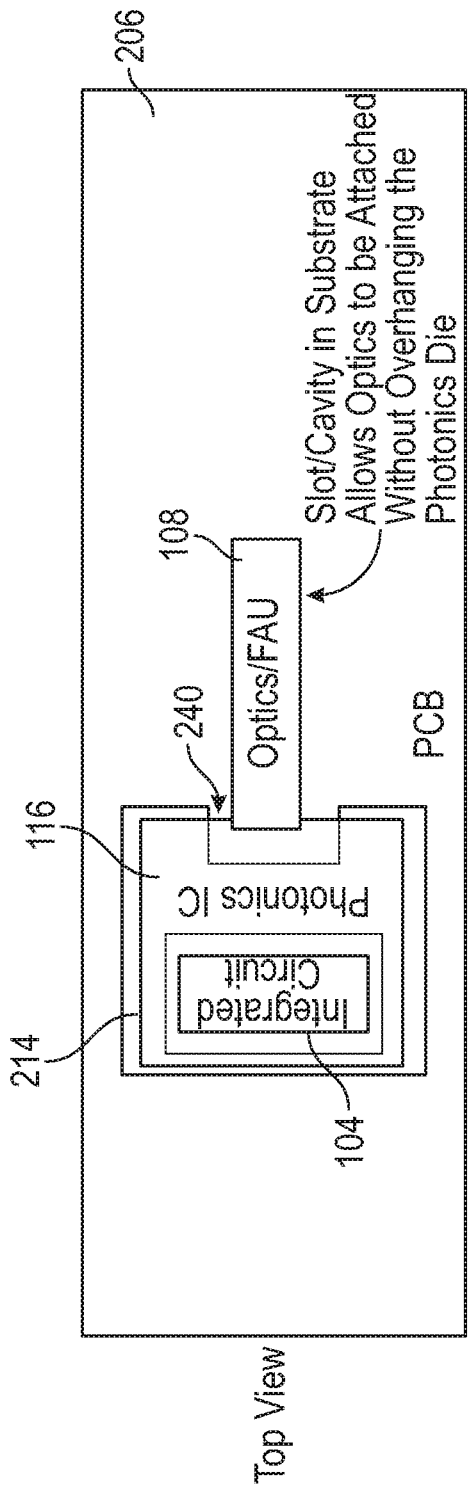
Figure 6K:
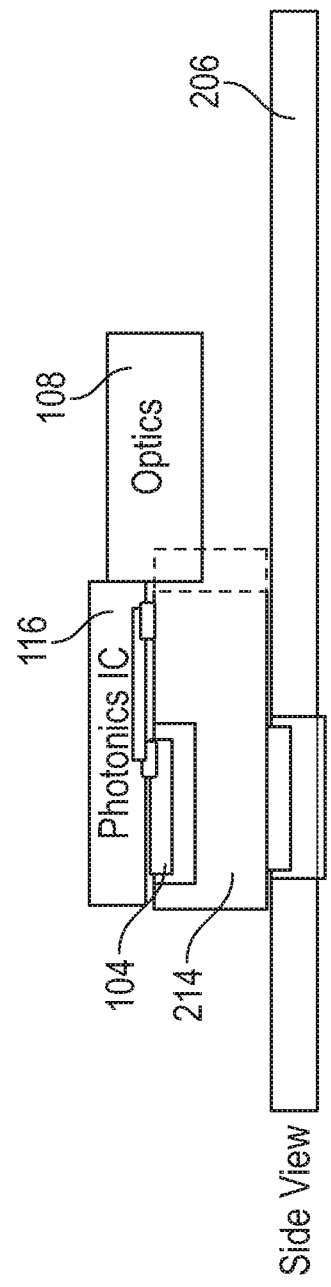
Figure 6N:
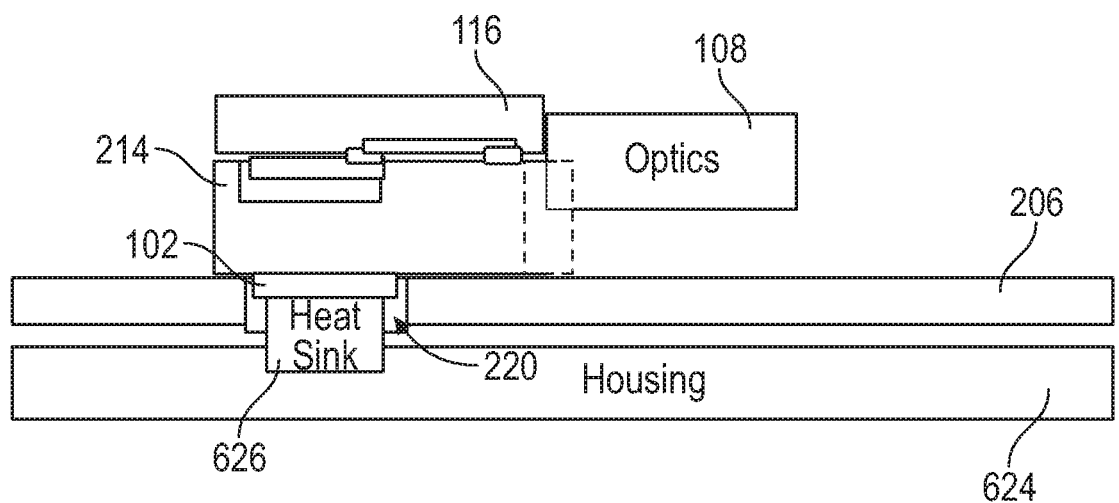

FIGS. 6A-6N illustrate example processes to fabricate an IC package (e.g., IC package 200), according to one embodiment. Although these processes are illustrated and described herein for IC package 200, the reader will understand that similar processes may be followed for fabricating any of the IC packages (e.g., IC package 300, IC package 400, IC package 500) described herein by making appropriate adjustments and/or substation of materials thereto.

As illustrated in FIG. 6A, an array of substrates 602 may be formed in a strip format (e.g., in volume production). The array of substrates 602 may be diced along the dotted lines 606 into individual substrate pieces 214. Each individual substrate 214 may be formed with (i) a cavity 230 on the top surface to accommodate an IC (e.g., IC 104, such as a MZI/TIA chip) and (ii) a cavity 240 on the side to allow the photonics die (e.g., photonics die 116) to overhang for optics attachment. As illustrated in FIG. 6B, a PCB 206 can be fabricated (or formed) with a cutout 220.

As illustrated in FIG. 6C, an IC (e.g., IC 102) can then be flip chip attached to a bottom surface of the substrate 214 (e.g., within the area 618). As illustrated in FIG. 6D (top view) and FIG. 6E (side view), a photonics die (IC) (e.g., photonics die 116) can be attached to an IC (e.g., IC 104). For example, the photonics die 116 can be chip on chip flip attached to the IC 104. As illustrated in FIG. 6F (top view) and FIG. 6G (side view), the substrate 214 (with the attached IC 102) may then be attached to the PCB 206. For example, the substrate 214 may be attached to the PCB 206, such that the IC 102 (attached to the substrate 214) is disposed in the cutout 220 of the PCB 206.

As illustrated in FIG. 6H (top view) and FIG. 6I (side view), the photonics die 116 (with the attached IC 104) can be attached to the substrate 214 (with the attached IC 102). For example, the photonics die 116 can be attached to the substrate 214, such that the IC 104 (attached to the photonics die 116) is disposed in the cavity 230 on the top surface of the substrate 214. As illustrated in FIG. 6J (top view) and FIG. 6K (side view), the optics (and/or fiber array unit (FAU)) 108 can be attached to the photonics die 116. For example, the optics 108 can be coupled to the photonics die 116, via the cavity 240. As noted above, the cavity 240 allows the optics 108 to be attached to the photonics die 116 without overhanging the photonics die 116. As illustrated in FIG. 6L, in some embodiments, an additional cutout area 620 can be formed in the PCB 206 to give the optics 108 additional flexibility when attaching to the substrate 214. As illustrated in FIG. 6M (top view) and FIG. 6N (side view), the PCB 206 can be inserted into housing 624. Additionally, as illustrated in FIG. 6N, a heat sink 626 can be added to the housing 624. The heat sink 626 is in contact with the IC 102 disposed in the cutout 220 of the PCB 206.

Figure 7:
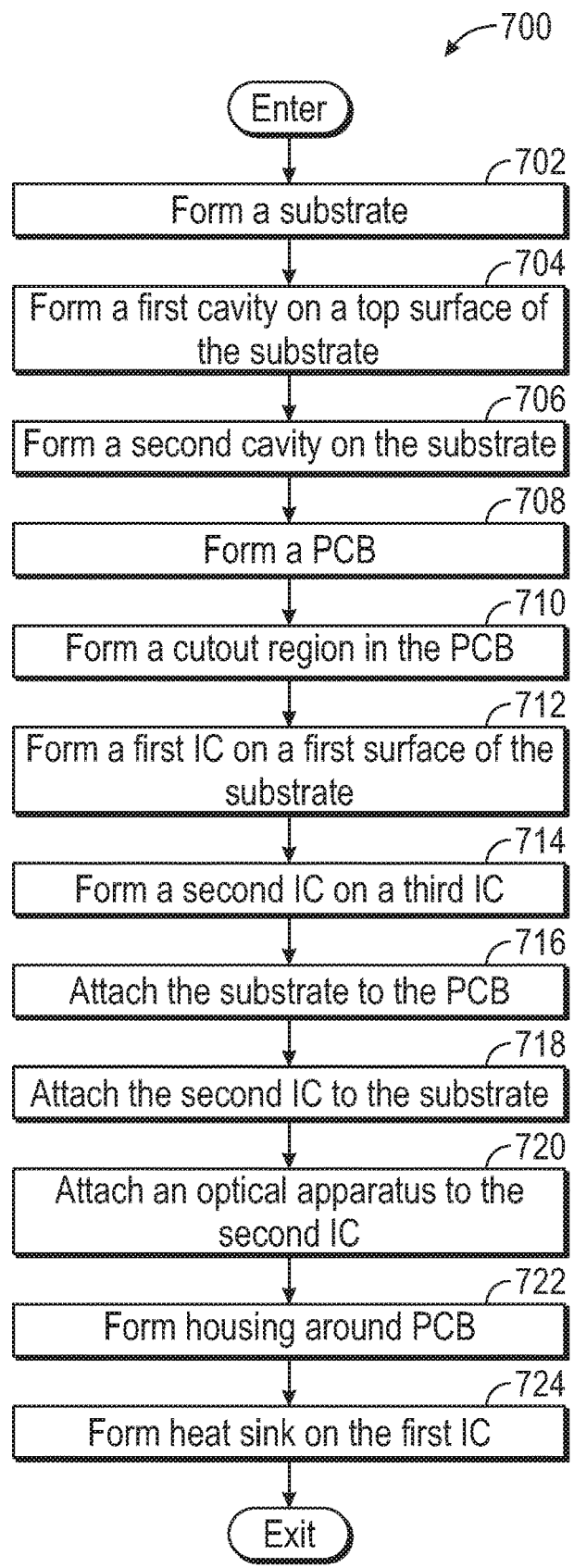
FIG. 7 is a flowchart of a method for fabricating a multi-chip package, according to one embodiment.

FIG. 7 is a flowchart of a method 700 for fabricating an IC package (e.g., IC package 200), according to one embodiment. The method 700 may be performed, for example, by a semiconductor processing chamber.

Method 700 enters at block 702, where a package substrate (e.g., substrate 214) is formed. At block 704, a first cavity (e.g., cavity 230) is formed on a top surface of the package substrate. At block 706, a second cavity (e.g., cavity 240) is formed on a top and side surface of the package substrate.

At block 708, a PCB (e.g., PCB 206) is formed. At block 710, a cutout region (e.g., cutout 220) is formed in the PCB. At block 712, a first IC (e.g., IC 102) is disposed on a bottom surface of the package substrate. At block 714, a second IC (e.g., photonics die/IC 116) is formed on a third IC (e.g., IC 104). At block 716, the package substrate is attached to the PCB, such that the first IC (attached to the package substrate) is disposed in the cutout region of the PCB. At block 718, the second IC is attached to the package substrate, such that the third IC (attached to the second IC) is disposed in the first cavity on the package substrate.

At block 720, an optical apparatus (e.g., optics 108) is attached to the second IC via the second cavity of the package substrate. At block 722, the PCB is disposed in a housing (e.g., housing 624). At block 724, a heat sink is formed on the first IC via the cutout region of the PCB. The method 700 may then exit.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. An integrated circuit (IC) package, comprising:
a printed circuit board (PCB) having a cutout region;
a substrate disposed above the PCB, wherein the substrate comprises (i) a first cavity on a first surface of the substrate and (ii) a second cavity on the first surface of the substrate;
a first IC disposed on a second surface of the substrate and in the cutout region of the PCB;
a second IC disposed above the substrate; and
a first device disposed on the second IC and in the first cavity on the first surface of the substrate.

2. The IC package of claim 1, further comprising a second device coupled to the second IC, wherein the second device is at least partially disposed in the second cavity.

3. The IC package of claim 2, wherein the second device is an optical device or a fiber array unit (FAU).

4. The IC package of claim 2, wherein the PCB further comprises a cavity disposed adjacent to the cutout region and below the second device.

5. The IC package of claim 1, wherein the first device comprises a third IC.

6. The IC package of claim 1, wherein the first device comprises a laser.

7. The IC package of claim 6, further comprising a third IC disposed on the first surface of the substrate.

8. The IC package of claim 1, further comprising a heat sink disposed on the first IC through the cutout region of the PCB.

9. A method for fabricating an integrated circuit (IC) package, comprising:

forming a printed circuit board (PCB) having a cutout region;

forming a substrate above the PCB, the substrate having at least (i) a first cavity on a first surface of the substrate and (ii) a second cavity on the first surface of the substrate;

forming a first IC on a second surface of the substrate and in the cutout region of the PCB;

forming a second IC above the substrate; and forming a first device on the second IC and in the first cavity on the first surface of the substrate.

10. The method of claim 9, further comprising forming a second device coupled to the second IC, wherein the second device is at least partially disposed in the second cavity.

11. The method of claim 10, wherein the second device is an optical device or a fiber array unit (FAU).

12. The method of claim 10, wherein forming the PCB further comprises forming a cavity adjacent to the cutout region and below the second device.

13. The method of claim 9, wherein the first device comprises a third IC.

14. The method of claim 9, wherein the first device comprises a laser.

15. The method of claim 14, further comprising forming a third IC on the first surface of the substrate.

16. The method of claim 9, further comprising forming a heat sink on the first IC through the cutout region of the PCB.

17. An optical transceiver module having a package comprising a plurality of integrated circuits (ICs), the package comprising:

a printed circuit board (PCB) having a cutout region;

a substrate disposed above the PCB, wherein the substrate comprises a first cavity on a top surface of the substrate;

a first IC of the plurality of ICs disposed on a bottom surface of the substrate and in the cutout region of the PCB;

a second IC of the plurality of ICs disposed above the substrate;

a third IC of the plurality of ICs disposed on the second IC and in the first cavity on the top surface of the substrate; and an optical device coupled to the second IC.

18. The optical transceiver module of claim 17, wherein:

the substrate further comprises a second cavity on the top surface of the substrate; and the optical device is partially disposed in the second cavity.

19. The optical transceiver module of claim 17, the package further comprising a heat sink disposed on the first IC through the cutout region of the PCB.

20. The optical transceiver module of claim 17, wherein the PCB further comprises a cavity disposed adjacent to the cutout region and below the optical device.

* * * * *